US007589972B2

(12) United States Patent
Ma et al.

(10) Patent No.: US 7,589,972 B2
(45) Date of Patent: Sep. 15, 2009

(54) ELECTRICAL CONNECTOR WITH CLIP MECHANISM

(75) Inventors: Hao-Yun Ma, Tu-Cheng (TW); Ming Lun Szu, Chandler, AZ (US); Derrell Wertz, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 28 days.

(21) Appl. No.: 11/807,148

(22) Filed: May 26, 2007

(65) Prior Publication Data

US 2008/0291638 A1 Nov. 27, 2008

(51) Int. Cl.
*H05K 7/20* (2006.01)

(52) U.S. Cl. ....................... 361/719; 361/700; 361/704; 165/80.3; 165/104.26; 165/185; 257/718; 257/719; 174/15.2; 174/16.3

(58) Field of Classification Search ....................... None
See application file for complete search history.

(56) References Cited

U.S. PATENT DOCUMENTS 5,381,305 A * 1/1995 Harmon et al. ............. 361/704
6,034,874 A * 3/2000 Watanabe ................... 361/704
6,130,821 A * 10/2000 Gerber ....................... 361/704
6,134,112 A * 10/2000 LeCornu et al. ............. 361/720
6,153,932 A * 11/2000 Liang ......................... 257/712
6,191,480 B1 * 2/2001 Kastberg et al. ............ 257/727
6,644,396 B2 * 11/2003 Liang ......................... 165/185
6,728,103 B1 * 4/2004 Smedberg ................... 361/703
6,816,375 B2 * 11/2004 Kalyandurg ................ 361/704
7,170,750 B2 * 1/2007 Tanaka ....................... 361/719
7,277,288 B2 * 10/2007 Lee et al. .................... 361/704

* cited by examiner

*Primary Examiner*—Boris L Chervinsky
(74) *Attorney, Agent, or Firm*—Wei Te Chung

(57) ABSTRACT

An electrical connector assembly (100) made in accordance with a preferable embodiment of the present invention comprises an electrical socket (20) with a plurality of contacts received therein, an IC module (30) mounted onto the electrical socket (20) so as to make electrical connection therebetween, a heat sink assembly (40) pressing on the IC module (30) and including a heat spreader (401), and a clip (50) fastening the heat sink assembly (40) above the IC module (30). The IC module (30) comprises a substrate (301) and at least one die (302) attached on a top surface of the substrate (301). The clip (50) has a set of first fingers (504) for pressing the die (301) of the IC module (30) and a set of second fingers (505) for pressing the substrate (301) of the IC module (30).

11 Claims, 6 Drawing Sheets

ELECTRICAL CONNECTOR WITH CLIP MECHANISM

BACKGROUND OF THE INVENTION

1. Field of the Invention

The present invention relates to an electrical connector assembly, and more particularly to an electrical connector assembly, in which an IC module is evenly applied pressure force so as to prevent potential warpage thereof.

2. Background of the Invention

U.S. Pat. No. 5,722,848 issued to Lai on Mar. 3, 1998 discloses a typical connector socket, which is generally referred to a ZIF (Zero Insertion Force) socket. The socket includes a base with a plurality of terminals received therein, and a cover moveably attached to the base. A lever with a cam mechanism is arranged between the base and the cover at a front portion so as to actuate the cover to move between a first position and a second position. When the lever is located in a vertical position, the cover is kept at the first position, in which a number of through holes in the cover are completely in alignment with corresponding passageways in the base, Then the pin legs of an IC module can be inserted from the cover into the passageways without any engagement with the terminals. When the IC module is completely seated on the cover, the lever is then manually operated by a user to move from the vertical position to a horizontal position, and simultaneously actuates the cover to move from the first position to the second position. The IC module attached on the cover moves together with the cover and the pin legs thereof gradually contact with the terminals in the electrical socket. The electrical socket of Lai is commonly available for a desk-top computer.

The IC module socket that used on a notebook is substantially similar to that used on the desktop computer, and the only difference is that the lever in Lai is replaced by a screw configured with a cam feature. When the screw is rotated, the cover is actuated to move along the base, therefore the pin legs of the IC module are then in contact with the terminals in the base.

As rapid development of computer technology, the number of input/output (I/O) of the IC module is accordingly increasing as well. In order to increase the number of I/O, conductive pads are introduced to replace the pin-type legs so as to directly and electrically contact with the terminals in the socket. U.S. Pat. No. 7,001,197 issued to Shirai on Feb. 21, 2006 just discloses this type of IC socket, which can be generally called a LGA socket.

As clearly shown in the Figures of Shirai, this type of electrical socket has different configuration with that of Lai, and includes a metal stiffener enclosing an insulating housing, on which an IC module is disposed. A metal clip is pivotally assembled to one end of the stiffener, and a lever is pivotally assembled to the other end of the stiffener. When the clip is operated to a closed position with respect to the stiffener, the lever locks the clip. By this arrangement, the clip is able to tightly press the IC module toward the housing to ensure reliable electrical connection between the IC module and the socket.

Shirai is feasible to be applied on the desktop computer because there is enough space in the computer for the operation of the lever. However, it is almost impossible to be applied on the notebook, due to the small space limited by the contour of the notebook.

The IC module generally includes a substrate, and a die/dies on the substrate. Even the IC module is rigid, it is still likely to deform or warp if downward force applied thereon is not evenly distributed.

SUMMARY OF THE INVENTION

One object of the present invention is to provide an electrical connector assembly employing a clip to fasten a heat sink assembly.

Another object of the present invention is to provide a clip for providing pressure force evenly distributed to an IC module.

In order to achieve the first object, an electrical connector assembly made in accordance with a preferable embodiment of the present invention comprises an electrical socket with a plurality of contacts received therein, an IC module mounted onto the electrical socket so as to make electrical connection therebetween, a heat sink assembly pressing on the IC module and including a heat spreader, and a clip fastening the heat sink assembly above the IC module. The IC module comprises a substrate and at least one die attached on a top surface of the substrate. The clip has a set of first fingers for pressing the die of the IC module and a set of second fingers for pressing the heat spreader.

In order to achieve the second object, a clip made in accordance with a preferable embodiment of the present invention for pressing a heat sink assembly toward an IC module comprises a base portion, a set of first fingers extending from the base portion and having first free ends distributed at a relative periphery position, and a set of second fingers extending from the base portion and having second free ends distributed at a relative central position. The first free ends are not coplanar with the second free ends.

Other objects, advantages and novel features of the present invention will become more apparent from the following detailed description when taken in conjunction with the accompanying drawings, in which:

DETAILED DESCRIPTION OF THE INVENTION

Embodiment A

Figure 1:
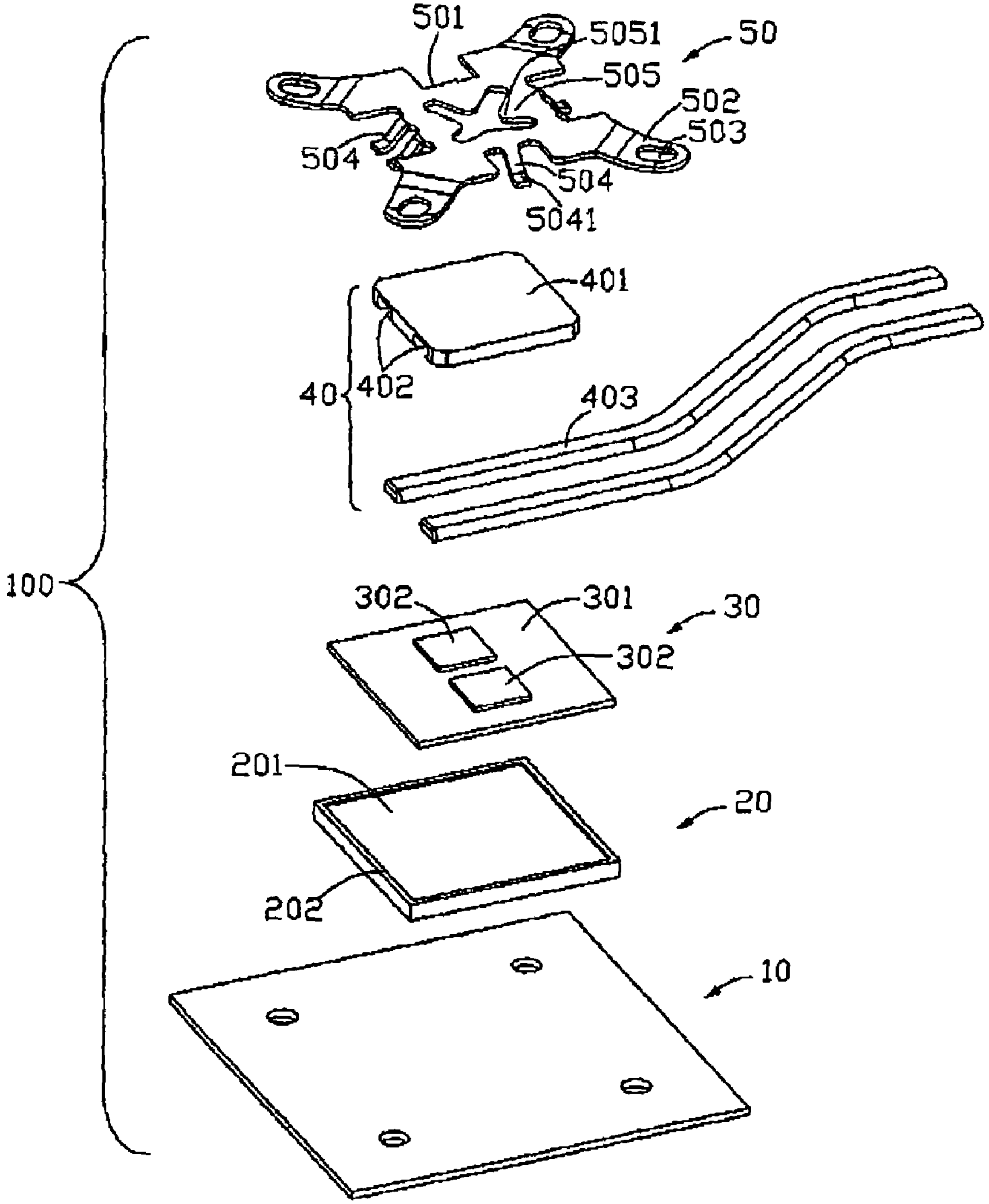
FIG. 1 is an exploded, isometric view of an electrical connector assembly according to a first embodiment of the present invention.
Figure 2:
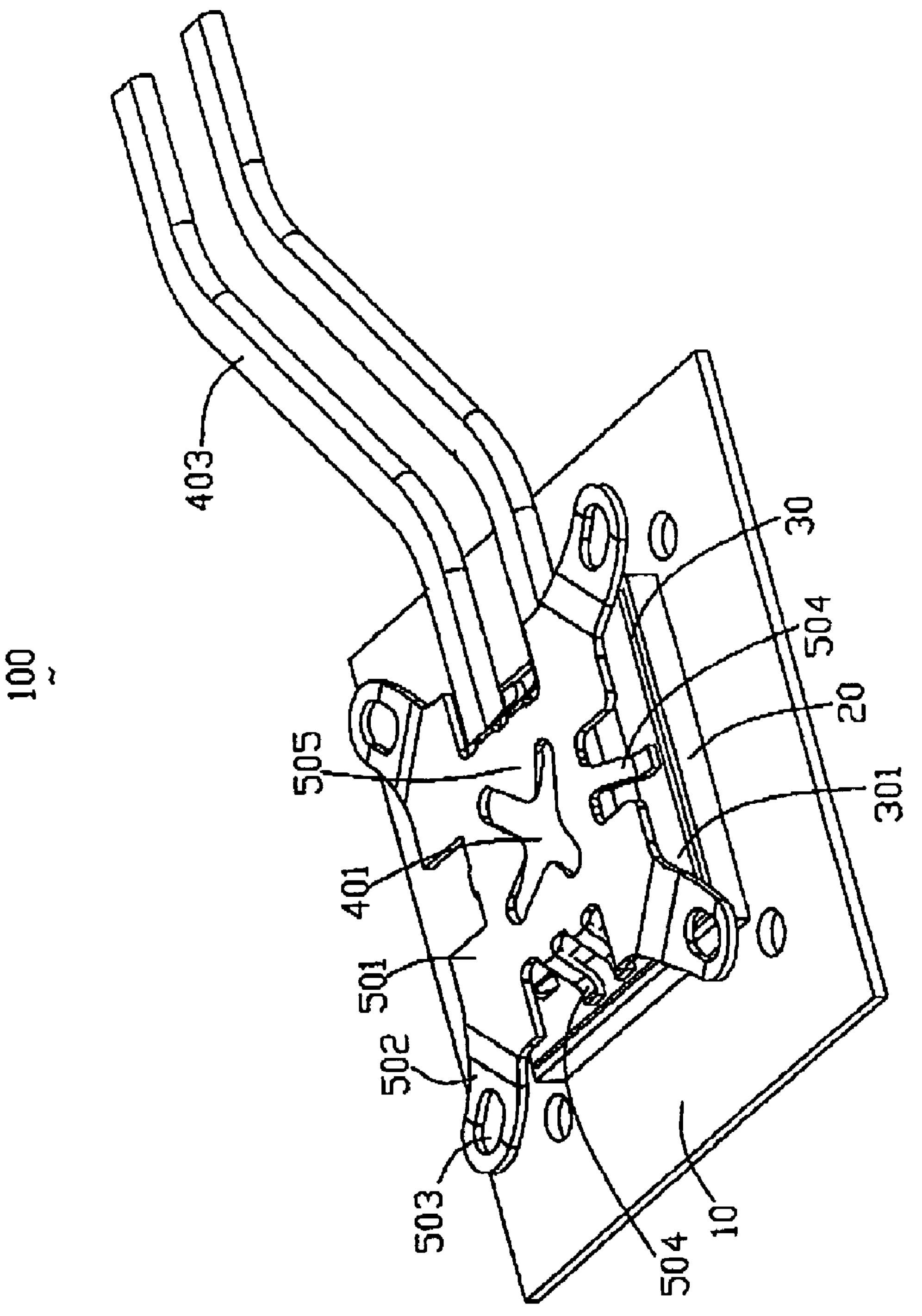
FIG. 2 is an assembled, isometric view of FIG. 1.

Referring to FIG. 1 to FIG. 2, an electrical connector assembly 100 in accordance with a first embodiment of the present invention includes an electrical socket 20 mounted on a PCB (printed circuit board) 10, an IC module 30 disposed on the electrical socket 20, a heat sink assembly 40 engaging with the IC module 30, and a clip 50 securely attached to the PCB 10 for pressing the heat sink assembly 40 toward the IC module 30.

The electrical socket 20 includes a rectangular base portion 201 and four side walls 202 extending integrally from the base portion 201 so as to together define an receiving cavity (not labeled) for the IC module 30. A number of contacts (not shown) are mounted within the base portion 201 to establish electrical connection with the IC module 30.

The IC module 30 includes a substrate 301 and a pair of dies 302 disposed on the substrate 301. The heat sink assembly 40 comprises a heat spreader 401 and a pair of heat pipes 403. The heat spreader 401 has two slots 402 at the bottom thereof respectively for receiving the heat pipes 403. The slots 402 extend through a bottom surface of the heat spreader 401 so as to allow the heat pipes 403 to directly touch the dies 302 of the IC module 30.

The clip 50, capable of being secured to the PCB 10, is provided to press the heat sink assembly 40 toward the IC module 30. The clip 50 comprises a substantial rectangular base portion 501, four legs 502 extending from corners of the base portion 501 and having holes 503 adapted to engage with screws (not shown) to secure the clip 50 to the PCB 10. A set of first fingers 504, for pressing the substrate 301 of the IC module 30, extend outward and downward integrally from four periphery edges of the base portion 501, and each of these first fingers 504 is formed with a first free end 5041 which directly engages with the substrate 301 of the IC module 30. A set of second fingers 505, for pressing the heat spreader 401, extend inward and downward integrally from a substantial central position of the base portion 501, and each of these second fingers 505 is formed with a second free end 5051 which directly engages with the heat spreader 401. Apparently, the first free ends 5041 are non-coplanar with the second free ends 5051, and the height difference between the first free ends 5041 and the second free ends 5051 is accurately dimensioned corresponding to the stack height of the die 302 and the heat spreader 401, so that the dies 302 and the substrate 301 of the IC module 30 are simultaneously exerted pressure force, respectively from the heat sink assembly 40 and the first fingers 504. In other words, the pressure force evenly distributed is provided to be applied onto the IC module 30 and therefore the potential warpage of the IC module 30 is prevented.

Embodiment B

Figure 3:
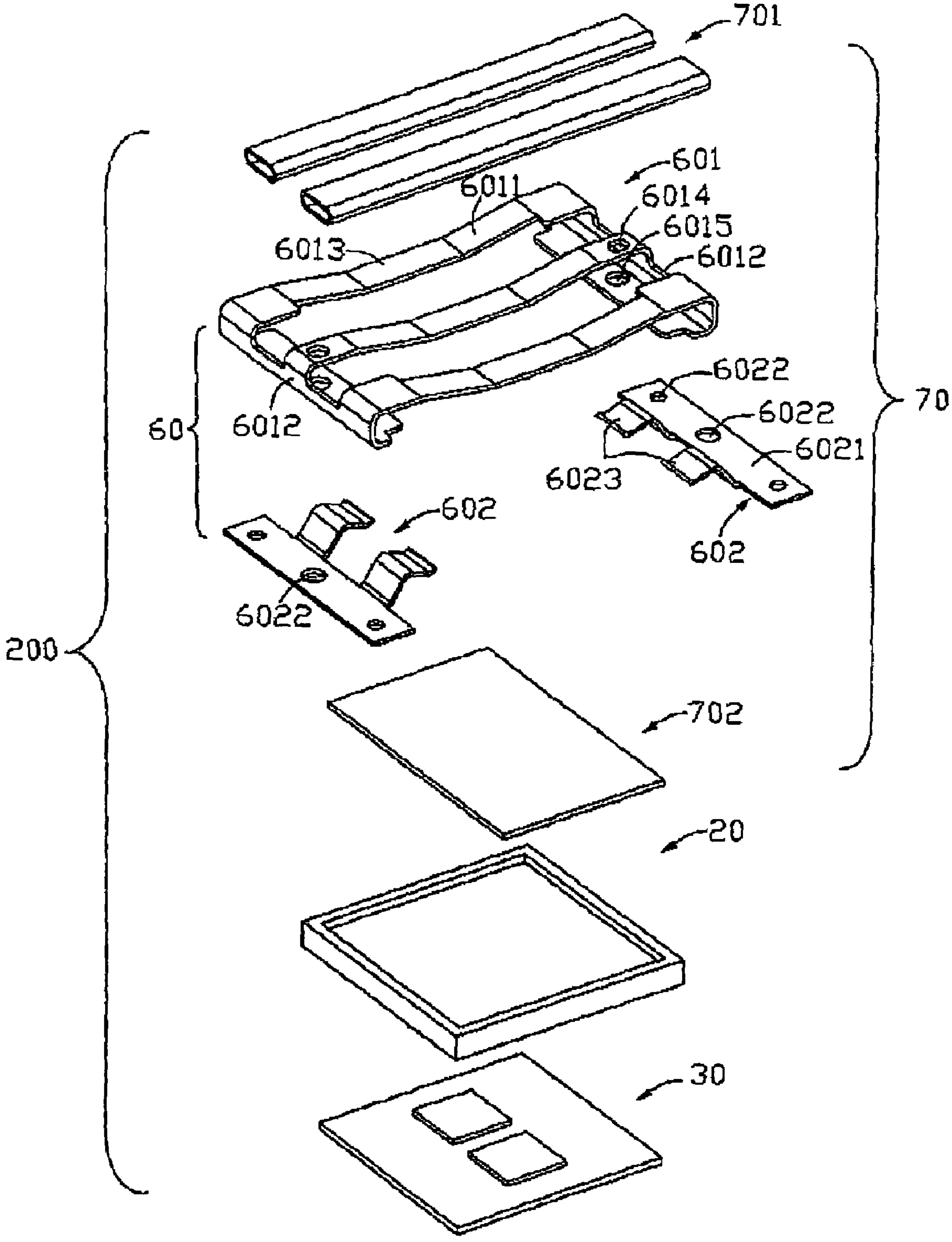
FIG. 3 is an exploded, isometric view of an electrical connector assembly according to a second embodiment of the present invention.
Figure 4:
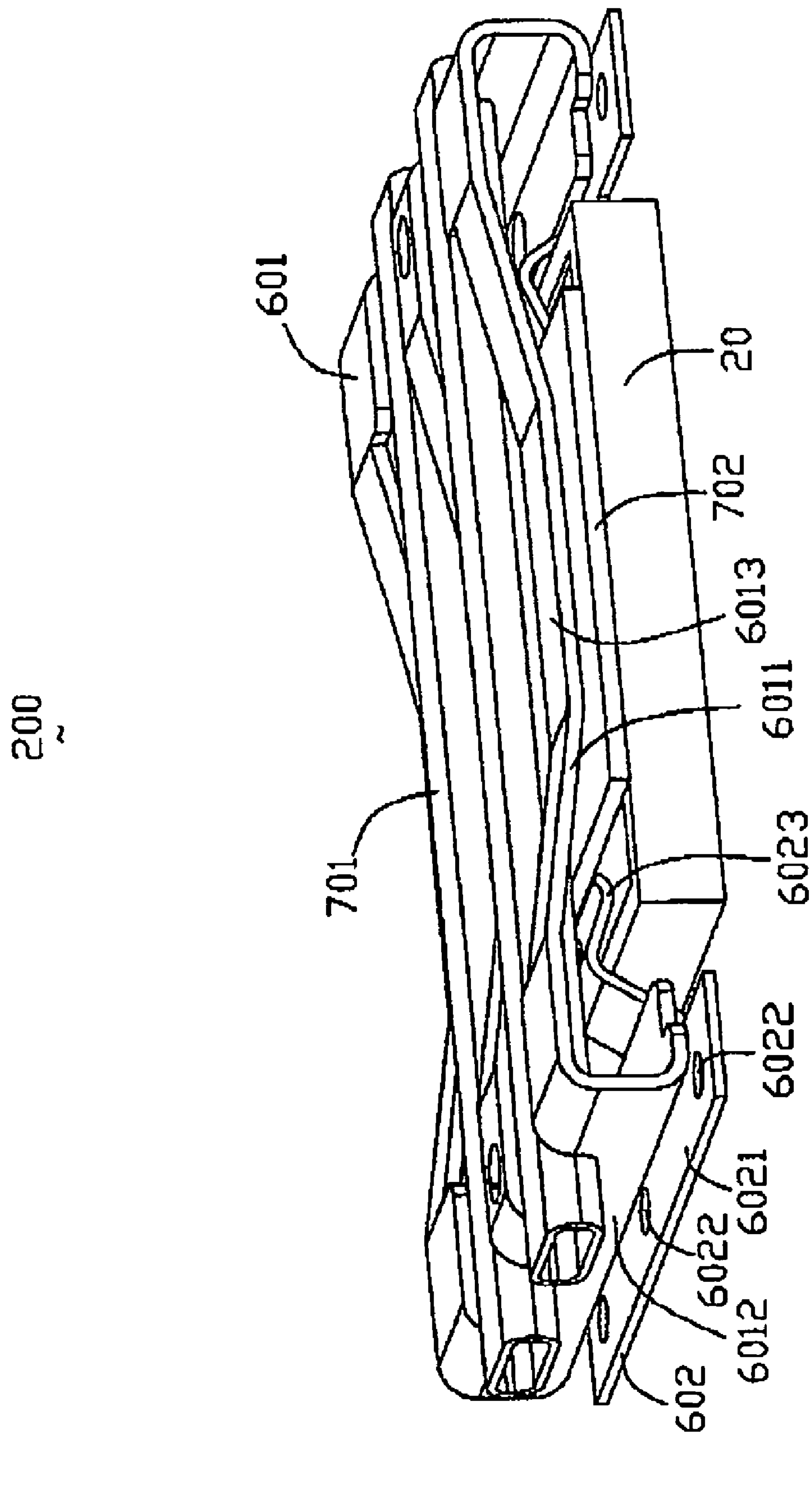
FIG 4 is an assembled, isometric view of FIG. 3.

Referring to FIG. 3 and FIG. 4, in this second embodiment, an electrical connector assembly 200 is provided to include an electrical socket 20, an IC package 30 to be seated on the electrical socket 20, a heat sink assembly 70, and a clip assembly 60 employed to secure the heat sink assembly 70. The electrical socket 20 and the IC module 30 have the same structure as that in the first embodiment, and details of which are not repeatly described herein.

The clip assembly 60 includes a first clip 601 and a pair of second clips 602. The second clips 602 are arranged opposite to each other and located under two ends of the first clip 601. The first clip 601 has three parallel spring beams 6011, each of which is formed with a recessed pressing portion 6013 at a central position thereof, and a pair of mounting portion 6012 formed at opposite ends of the spring beams 6011 and perpendicular to the spring beams 6011. Among these three parallel spring beams 6011, the one at the middle position has two securing holes 6014 respectively formed at two ends thereof, and correspondingly, a pair of securing holes 6015 are respectively formed on the mounting portions 6012 as well. The second clip 602 has a mounting portion 6021 formed with three mounting holes 6022, and a pair of clipping portions 6023 extending from the mounting portion 602. Among the three mounting holes 6022 on the second clip 602, the central one is in alignment with the securing holes 6014, 6015 of the first clip 601, so as to facilitate screws (not shown) to mount the clip assembly 60 to a PCB.

The heat sink assembly 70 comprises a pair of heat pipes 701 and a heat spreader 702 under the heat pipes 701. The heat pipes 701 can be attached to the first clip 601 by interferencely engaging with two neighboring spring beams 6011 and positioning therebetween. Besides, soldering method is also feasible for securing the heat pipes 701 to the first clip 601. The pressing portions 6013 press on the heat spreader 702, which farther directly presses on the dies of the IC module 30. Simultaneously the clipping portions 6023 of the second clips 602 press on the substrate of IC module 30 so that the dies and the substrate of the IC module 30 are simultaneously exerted pressure force, respectively from the heat sink assembly 70 and the second clip 602. In other words, the pressure force evenly distributed is provided to be applied onto the IC module 30 and therefore the potential warpage of the IC module 30 is prevented.

Embodiment C

Figure 5:
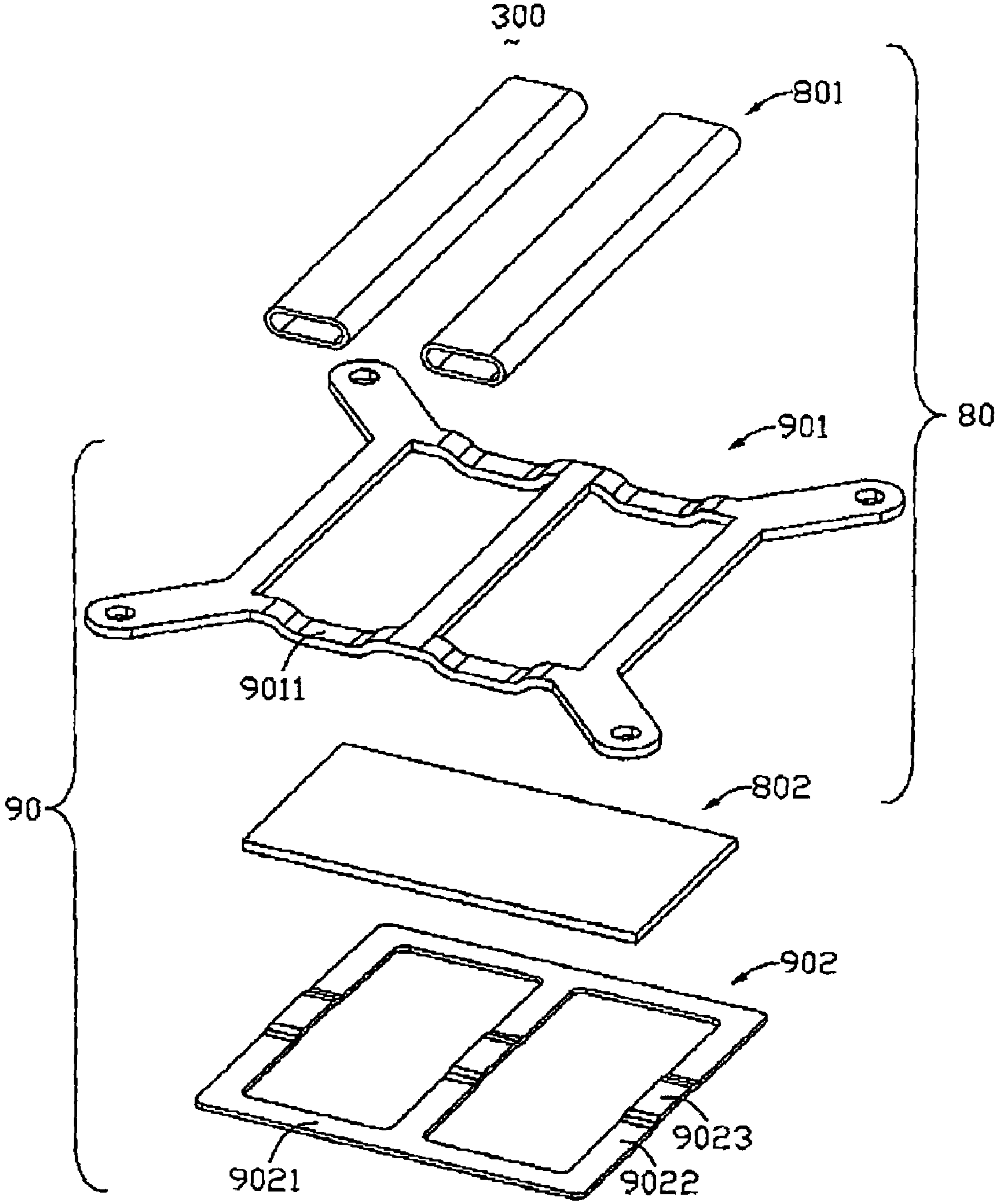
FIG. 5 is an exploded, isometric view of an electrical connector assembly according to third embodiment of the present invention, in which the electrical socket and the IC module are not shown.
Figure 6:
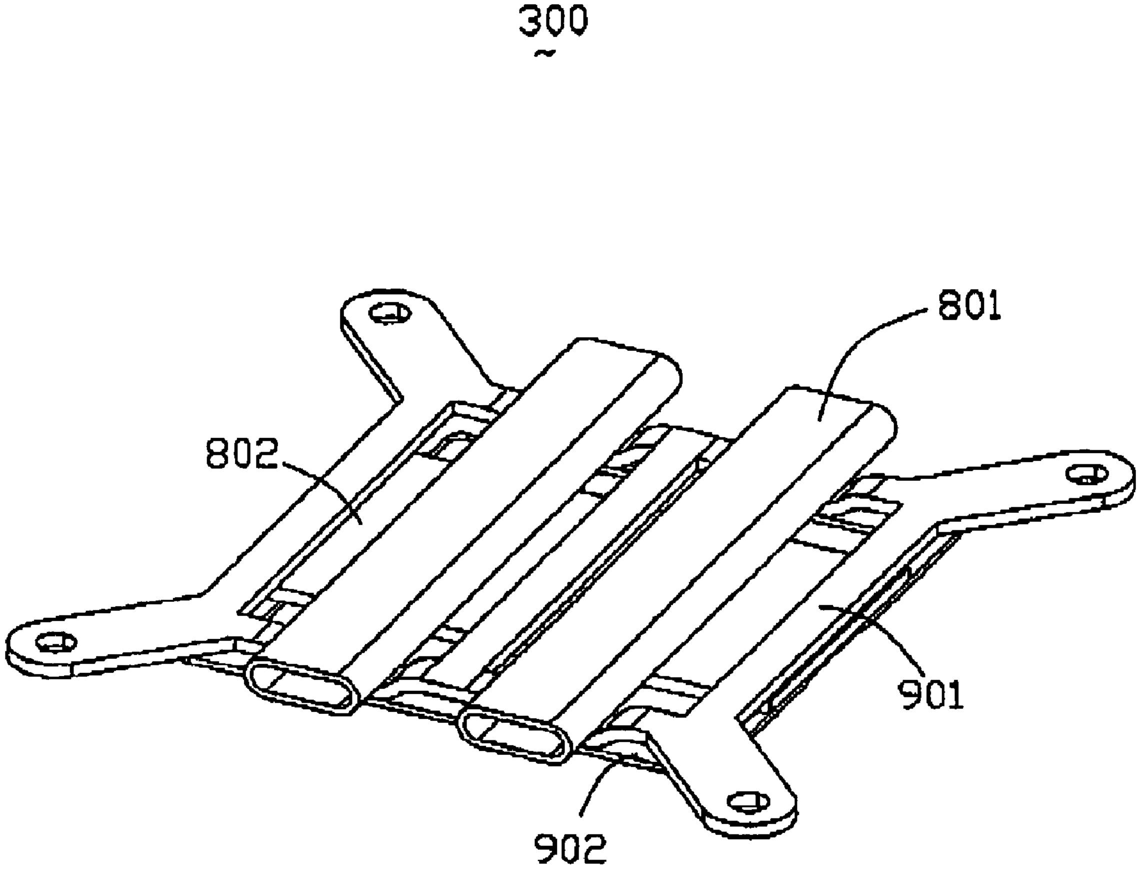
FIG. 6 is an assembled, isometric view of FIG. 5.

An electrical connector assembly 300 as a third embodiment is illustrated in FIG. 5 and FIG. 6, in which the electrical socket and the IC module that have the same structures as that described the first and the second embodiments, are omitted in FIG. 5 and FIG. 6. In this embodiments the clip assembly 90, provided to secure a heat sink assembly 80, includes a clip 901 and a loading frame 902. The clip 901 has two pairs of recessed pressing portions 9011 extending downward from two opposite edges thereof. The loading frame 902 has a pair of row edges 9021 and there parallel column beams 9022 perpendicular to the row edges 9021. Each of the column beams 9022 is formed with an elevated portion 9023. The heat sink assembly 80 includes a pair of heat pipes 801 adapted to be located on the recessed pressing portions 9011 of the clip 901, and a heat spreader 802 positioned under the clip 901 and between the two pairs of the recessed pressing portions 9011. When the heat sink assembly 80 is in an assembled state, the recessed pressing portions 9011 abut against the row edges 9021 of the loading frame 902, and then the loading frame 902 directly press on the substrate of the IC package. The elevated portions 9023 are lifted up to abut against the heat spreader 802, and are dimensioned to allow the dies of the IC module to accurately touch the heat spreader 802. Therefore, the dies and the substrate of the IC module are simultaneously exerted pressure force, and potential warpage of the IC module is thereby prevented.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector assembly comprising:

an electrical socket with a plurality of contacts received therein;

an IC module mounted onto the electrical socket so as to make electrical connection therebetween, the IC module comprising a substrate and at least one die attached on a top surface of the substrate;

a heat sink assembly pressing on the IC module and including a heat spreader; and a clip fastening the heat sink assembly above the IC module, the clip having a set of first fingers pressing the substrate of the IC module and a set of second fingers pressing the heat spreader.

2. The electrical connector assembly as claimed in claim 1, wherein the first fingers have first free ends distributed at a relative periphery position, and the second fingers have second free ends distributed at a relative central position, the first free ends being not coplanar with the second free ends.

3. The electrical connector assembly as claimed in claim 2, wherein the height difference of the first free ends and the second free ends is dimensioned corresponding to the stack height of the die and the heat sink assembly, so that the die and the substrate of the IC module are simultaneously applied pressure force.

4. The electrical connector assembly as claimed in claim 1, wherein the clip has a base portion, a plurality of legs extending from the base portion and having mounting holes adapted to secure the clip to a printed circuit board.

5. The electrical connector assembly as claimed in claim 1, wherein said heat spreader defines at least one slot in an undersurface thereof to receive a heat pipe therein under condition of said heat pipe directly engaging the die.

6. The electrical connector assembly as claimed in claim 5, wherein the heat pipe is imposed with a downward force derived from the clip via said spreader.

7. An electrical connector assembly comprising:

an electrical socket with a plurality of contacts received therein;

an IC module mounted onto the electrical socket so as to make electrical connection therebetween, the IC module comprising a substrate and at least one die attached on a top surface of the substrate;

a heat sink assembly pressing on the IC module and including a heat spreader; and a clip fastening the heat sink assembly above the IC module, the clip having a set of first fingers for pressing the substrate of the IC module and a set of second fingers for pressing the heat spreader;

wherein the first fingers have first free ends distributed at a relative periphery position, and the second fingers have second free ends distributed at a relative central position, the first free ends being not coplanar with the second free ends;

wherein the first free ends extend outward and downward, and the second free ends extend inward and downward.

8. The electrical connector assembly as claimed in claim 7, wherein said heat spreader defines at least one slot in an undersurface thereof to receive a heat pipe therein under condition of said heat pipe directly engaging the die.

9. The electrical connector assembly as claimed in claim 8, wherein the heat pipe is imposed with a downward force derived from the clip via said spreader.

10. A clip for pressing a heat sink assembly toward an IC module comprising:

a base portion;

a set of first fingers extending from the base portion and having first free ends distributed at a relative periphery position; and a set of second fingers extending from the base portion and having second free ends distributed at a relative central position;

wherein the first free ends are not coplanar with the second free ends;

wherein the first free ends extend outward and downward, and the second free ends extend inward and downward.

11. The clip as claimed in claim 10, wherein the clip has a plurality of legs extending from the base portion and having mounting holes adapted to secure the clip to a printed circuit board.

* * * * *